United States Patent [19]
Takahashi et al.

[11] Patent Number: 6,019,212
[45] Date of Patent: Feb. 1, 2000

[54] APPARATUS FOR ALIGNING PARTS

[75] Inventors: Shigeki Takahashi; Nihei Kaishita, both of Omihachiman, Japan

[73] Assignee: Murata Manufacturing Co., Ltd., Nagaokakyo, Japan

[21] Appl. No.: 09/102,877

[22] Filed: Jun. 24, 1998

[30] Foreign Application Priority Data

Jul. 8, 1997 [JP] Japan .................................. 9-199371

[51] Int. Cl.[7] .................................................. B65G 1/00
[52] U.S. Cl. ...................... 198/392; 198/396; 198/397.03
[58] Field of Search .................................... 198/392, 393, 198/397.01, 397.03, 396; 221/167, 168, 171

[56] References Cited

U.S. PATENT DOCUMENTS

| | | | |
|---|---|---|---|
| 2,433,096 | 12/1947 | Davis | 198/397.03 |
| 4,238,023 | 12/1980 | Millar et al. | 198/392 |
| 5,343,997 | 9/1994 | Maerkedahl | 198/392 |

FOREIGN PATENT DOCUMENTS 8-143164  6/1996  Japan .

1 411 952  10/1975  United Kingdom .

*Primary Examiner*—William E. Terrell
*Assistant Examiner*—Khoi H. Tran
*Attorney, Agent, or Firm*—Burns, Doane, Swecker & Mathis, LLP

[57] ABSTRACT

A part-aligning apparatus is provided which is not overly complex in structure, which reduces the damage to chip parts, and which operates well even if its chip discharge passage is clogged or overflows. The apparatus has a part-holding chamber for accommodating a number of chip parts. The chamber is formed between a stationary drum and a rotary drum. The rotary drum has an annular portion forming an outer wall of the part-holding chamber. An arc-shaped chute groove is formed in the inner surface of the annular portion. At least one gate hole extends through the annular portion and is in communication with the chute groove. An arc-shaped guide groove corresponding in position to the outer opening of the gate hole is formed in the inner surface of the stationary drum. A discharge passage is formed at the lower end of the guide groove. The rotary drum is rotated to align the chip parts and to deliver the chip parts into the discharge passage via the chute groove, the gate hole and guide groove.

20 Claims, 9 Drawing Sheets

DISCHARGE DIRECTION

APPARATUS FOR ALIGNING PARTS

This application corresponds to Japanese Patent Application No. 9-199371, filed on Jul. 8, 1997, which is hereby incorporated by reference in its entirety.

BACKGROUND OF THE INVENTION

The present invention relates to an apparatus for aligning a multiplicity of chip parts, introduced into a part-holding chamber, in a row and delivering the chip parts in succession.

Known part-aligning apparatus of the above-mentioned kind include bulk feeders and vibrating ball feeders. Bulk feeders are roughly classified into pneumatically driven bridge-breaking type feeders and bridge-breaking type feeders using an upward-thrusting pin. In the case of the pneumatically driven type of feeder, it is difficult to adjust the amount and direction of airflow. In the case of the upward-thrusting pin type of feeder, whenever an operation is performed, the pin impacts the parts and therefore the parts tend to be easily scratched or damaged. In both types of feeders, every chip part is forced toward a funnel-like exit. Therefore, if a bridge-breaking operation is performed once, the bridge may be immediately restored. As a consequence, the efficiency at which parts are aligned is low. In the case of the vibrating ball type of feeder, bridges are not readily formed. However, this equipment is expensive. Also, unwanted vibration is easily transmitted to other apparatus. Furthermore, a large space is required for this type of equipment.

A part-aligning apparatus free of these problems is proposed in Japanese Unexamined Patent Publication No. 143164/1996. This apparatus comprises a cylindrical stocker for holding chip parts, an annular body disposed on the outer surface of the outer curved wall of the stocker, and a rotary disk having an annular indexing portion. This indexing portion is rotatably disposed in the gap between the outer curved wall of the stocker and the inner surface of the annular body. The indexing portion has a plurality of chip-holding recesses for individually seizing the chip parts. A chip discharge hole in communication with a chip storage portion is formed near the bottom of the outer wall of the stocker and in the path over which the chip-holding recesses are moved. In this case, movement is provided only by rotary motion and so it is easy to make an adjustment. The chip parts are damaged to a lesser extent. In addition, the apparatus can be made having a smaller size than the aforementioned apparatus.

The above-described part-aligning apparatus requires at least the stocker, the annular body, and the rotary disk. Therefore, this apparatus is complex in structure and often breaks down. It is necessary that the rotary disk be provided with chip-holding recesses arranged circumferentially, the recesses conforming to the shapes of the individual chip parts. In order to align micrometer chip parts having a length of about 1 mm, the chip-holding recesses must be processed in correspondingly small size. Hence, the apparatus is very complex in structure and requires much labor to machine, thus increasing the cost of the apparatus.

The chip parts are held, one after another, by the chip-holding recesses in the indexing portion of the rotary disk. As the disk turns, the chip parts are forced toward a chute. Therefore, if the chute becomes clogged or overflows for some reason, a chip part subsequently fed in will be caught in the chute. As a result, the chip part may be damaged or the apparatus itself may break down. At this time, therefore, it is necessary to quickly stop the rotary disk using a "full occupation" sensor.

SUMMARY OF THE INVENTION

It is an exemplary object of the present invention to provide a part-aligning apparatus that is not overly complex in structure, which produces less damage to chip parts to be aligned, and which functions well even if the chip discharge passage thereof becomes clogged or overflows.

The above object is achieved by an apparatus comprising: a part-holding chamber for accommodating a multiplicity of chip parts; a rotary drum having an annular portion forming an outer wall of the part-holding chamber; and a stationary drum. At least one chute groove is formed in the inner surface of the annular portion. At least one gate hole extends through the annular portion from its inner to outer surface and is in communication with the chute groove. At least one arc-shaped guide groove is formed in the inner surface of the stationary drum and corresponds in position to the outer opening of the gate hole. A discharge passage is connected with the lower end of the guide groove. The chute groove, the gate hole, and the discharge passage are so shaped as to align the chip parts in a row and to discharge them in succession. The rotary drum is rotated to align the chip parts and to discharge them from the chute groove into the discharge passage through the gate hole and the guide groove.

The chip parts introduced into the part-holding chamber are kept on the inner surface of the bottom of the chamber by gravity and thereby fall into the chute groove. Since the chute groove is formed having a desired width, the chip parts fall into the chute groove and are oriented in a given direction. Since the rotary drum turns, the chip parts falling into the chute groove slide down the chute groove and enter the gate port. At this time, the chip parts are aligned in a row. For example, where each chip part assumes a boxlike shape, i.e., the length is greater than the width and the height, if the width of the chute groove is set slightly larger than the width and the height of the chip part and smaller than the length of the chip part, the chute groove can align the chip parts in the vertical direction. A chip part sliding along the chute groove while maintaining its elevated orientation comes to a stop at the entrance of the gate hole, thus clogging it. However, since the rotary drum rotates, the chip part stopped at the entrance of the gate hole drops downward when the chip part is rotated to the top. Thus, the clogging is removed by virtue of the rotation of the drum and the effects of gravity. The chip part entering the gate hole is slid downward due to gravity and reaches the outer surface of the annular portion, i.e., the inner surface of the stationary drum. The chip parts then fall into the guide groove and then slide downward within the guide groove. These parts are discharged via the discharge passage while arrayed in a given direction.

In one embodiment, the discharge passage is substantially tangent to the guide groove. In this case, movement of each chip part from the guide groove into the discharge passage is rendered smooth.

In addition, in one embodiment, the gate hole is formed substantially tangent to the chute groove so that each chip part sliding down the chute groove smoothly enters the gate hole.

Furthermore, in one embodiment, an inclined surface is formed to cause each chip part to slide toward the chute groove. In this case, each chip part more easily falls into the chute groove, and the efficiency of alignment is improved. The inclined surface is not limited to a flat surface. It may also include a curved surface.

If plural chute grooves are formed in parallel laterally in the annular portion of the rotary drum, and if plural guide grooves are formed in parallel laterally in the inner surface of the stationary drum, the alignment efficiency is multiplied by an integer per revolution of the rotary drum.

The present invention is very advantageous where it is used for alignment of chip parts in a boxlike form, i.e., the length is greater than the vertical and lateral dimensions. The width of the chute groove and the width of the guide groove should be set greater than the height H and the width W and less than the length L of each chip part. The depth of the chute groove and the depth of the guide groove are set greater than the height H and the width W and less than the length L of each chip part.

Note that the invention can be utilized for alignment and supply of cubic chip parts and cylindrical chip parts, as well as boxlike chip parts.

BRIEF DESCRIPTION OF THE DRAWINGS

The foregoing, and other, objects, features and advantages of the present invention will be more readily understood upon reading the following detailed description in conjunction with the drawings in which.

DESCRIPTION OF THE PREFERRED EMBODIMENTS

Figure 7:
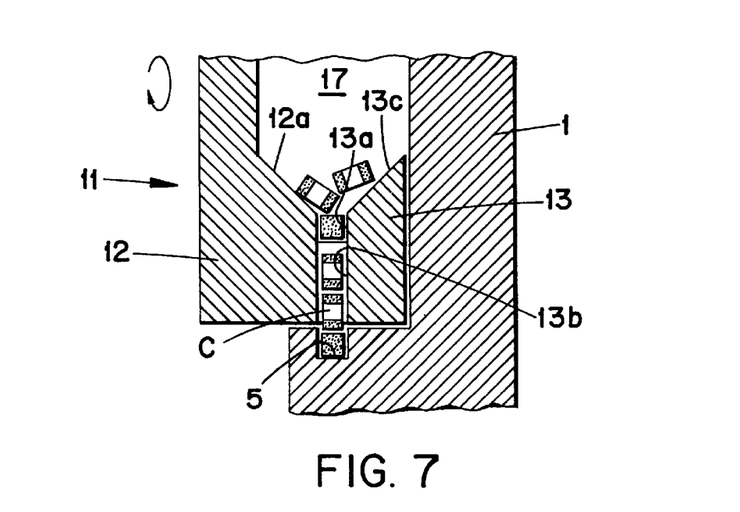
FIG. 7 is a cross-sectional view taken along line X—X of FIG. 6.
Figure 8:
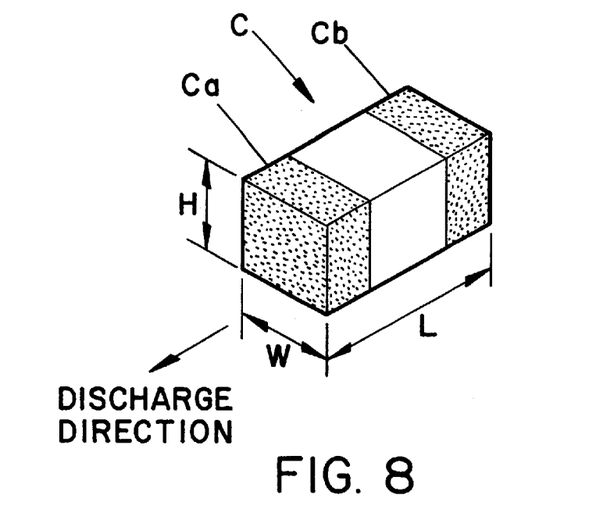
FIG. 8 is a perspective view of one example of a chip part.

An exemplary part-aligning apparatus in accordance with the present invention is shown in FIGS. 1–7. This apparatus aligns chip parts, one example of which is shown in FIG. 8. The chip part C shown in FIG. 8 has boxlike form and has a height of H, a width of W, and a length of L (where H≈W, L>H, and L>W). Electrodes Ca and Cb are formed at longitudinal ends, respectively, of the chip part C.

Figure 1:
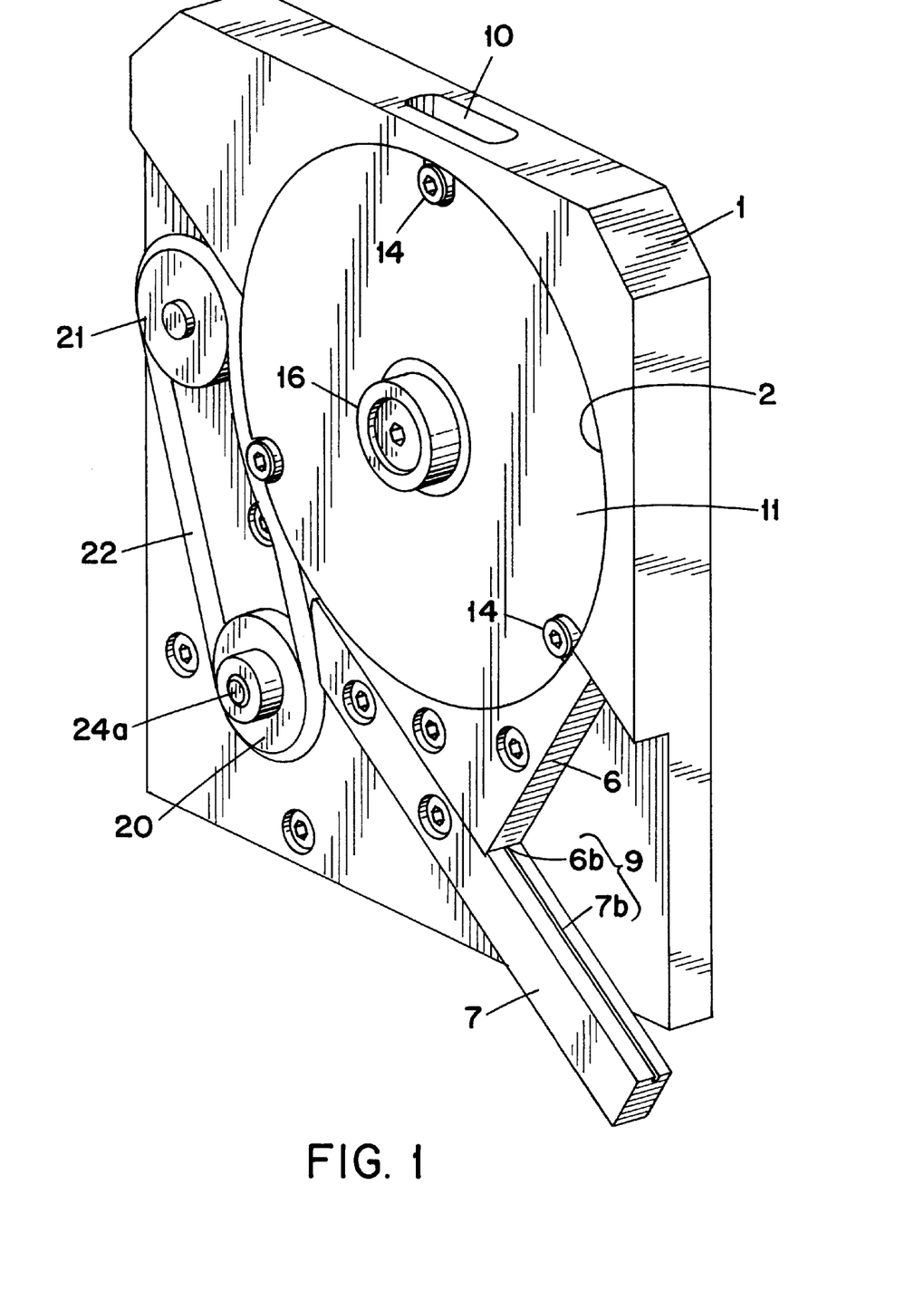
FIG. 1 is a perspective view of an exemplary part-aligning apparatus in accordance with the present invention.
Figure 2:
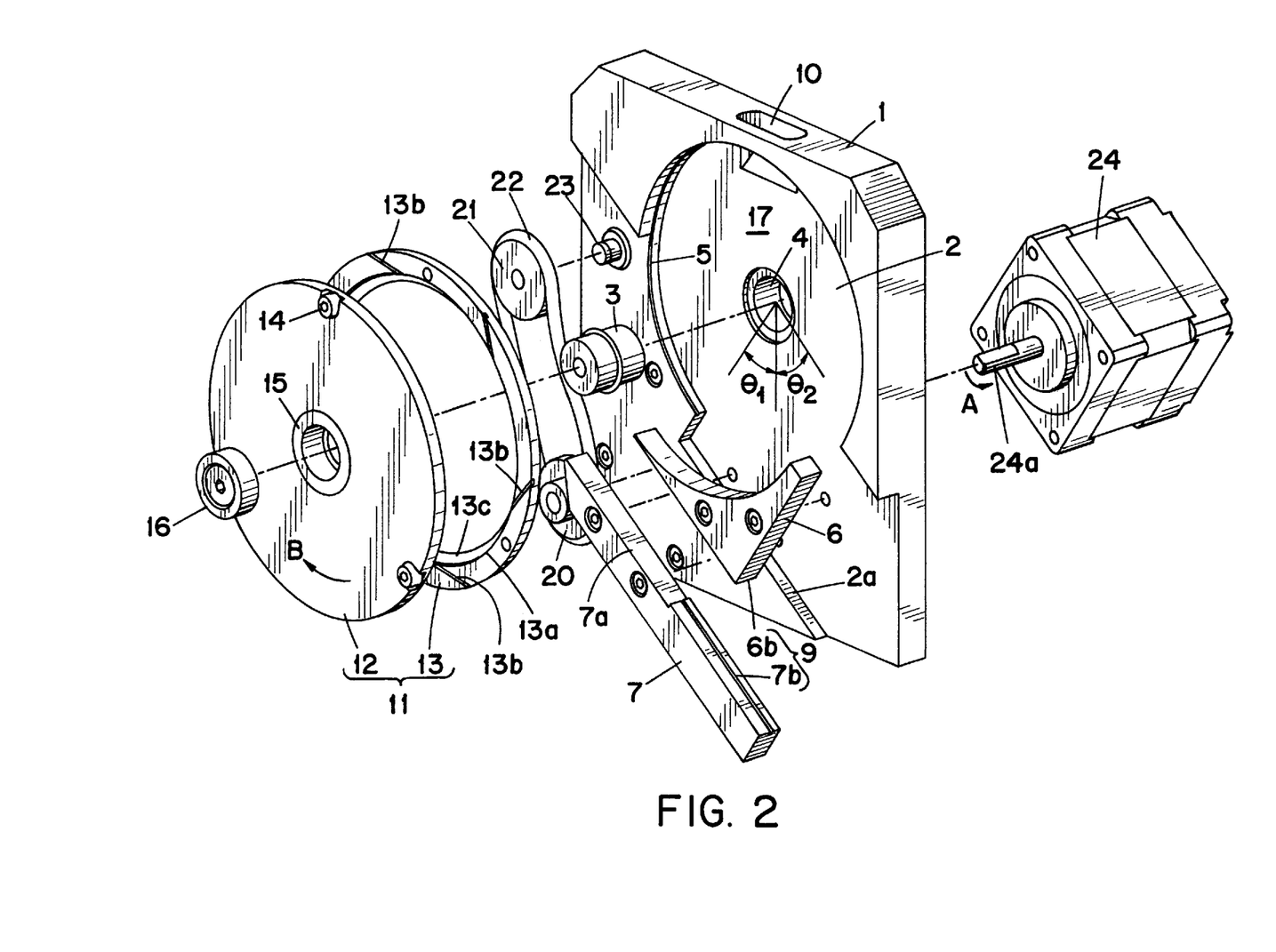
FIG. 2 is an exploded perspective view of the part-aligning apparatus shown in FIG. 1.
Figure 3:
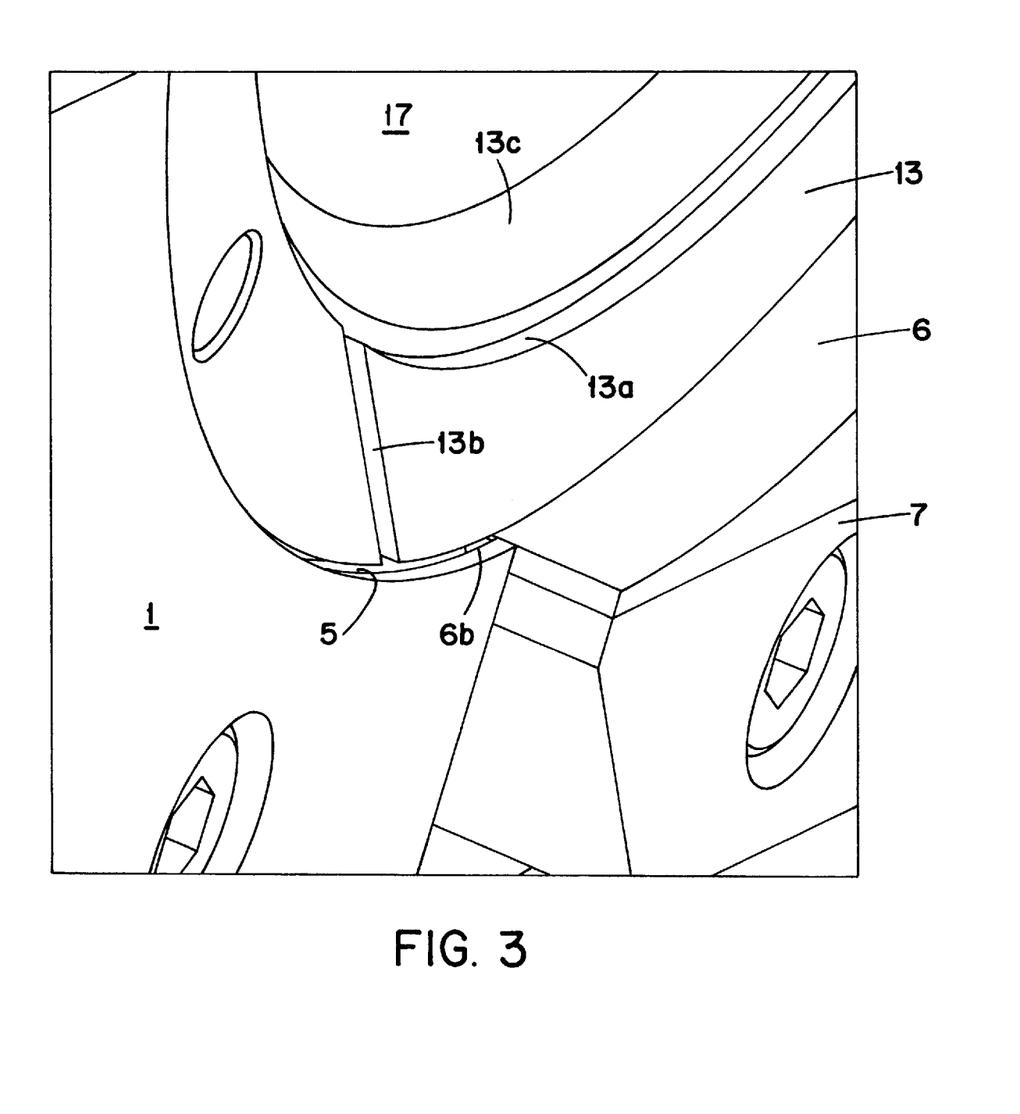
FIG. 3 is an enlarged perspective view of the gate port of the part-aligning apparatus shown in FIG. 1.

A stationary drum 1 is made of a hard plate placed vertically and is provided with a substantially circular recess 2 in its surface as shown in FIG. 2. A holding hole 4 in which a rotating shaft 3 is fitted and held is formed in the center of the recess 2. A substantially arc-shaped guide groove 5 is formed in the inner surface of the recess 2 such that its width is equal to the sum of the width W of the chip part C and a given clearance and its depth is equal to the sum of the height H of the chip part C and a certain clearance. An angle $\theta_1$ extends from one edge of the circular recess 2 to a plumbline extended from the center of the recess 2. An angle $\theta_2$ extends from another edge of the circular recess 2 to the same plumbline. The angles $\theta_1$ and $\theta_2$ together demarcate a cutout 2a. A first block 6 is screwed or otherwise fixed to this cutout 2a. A continuous arc-shaped surface is formed across both recess 2 and block 6.

Figure 4:
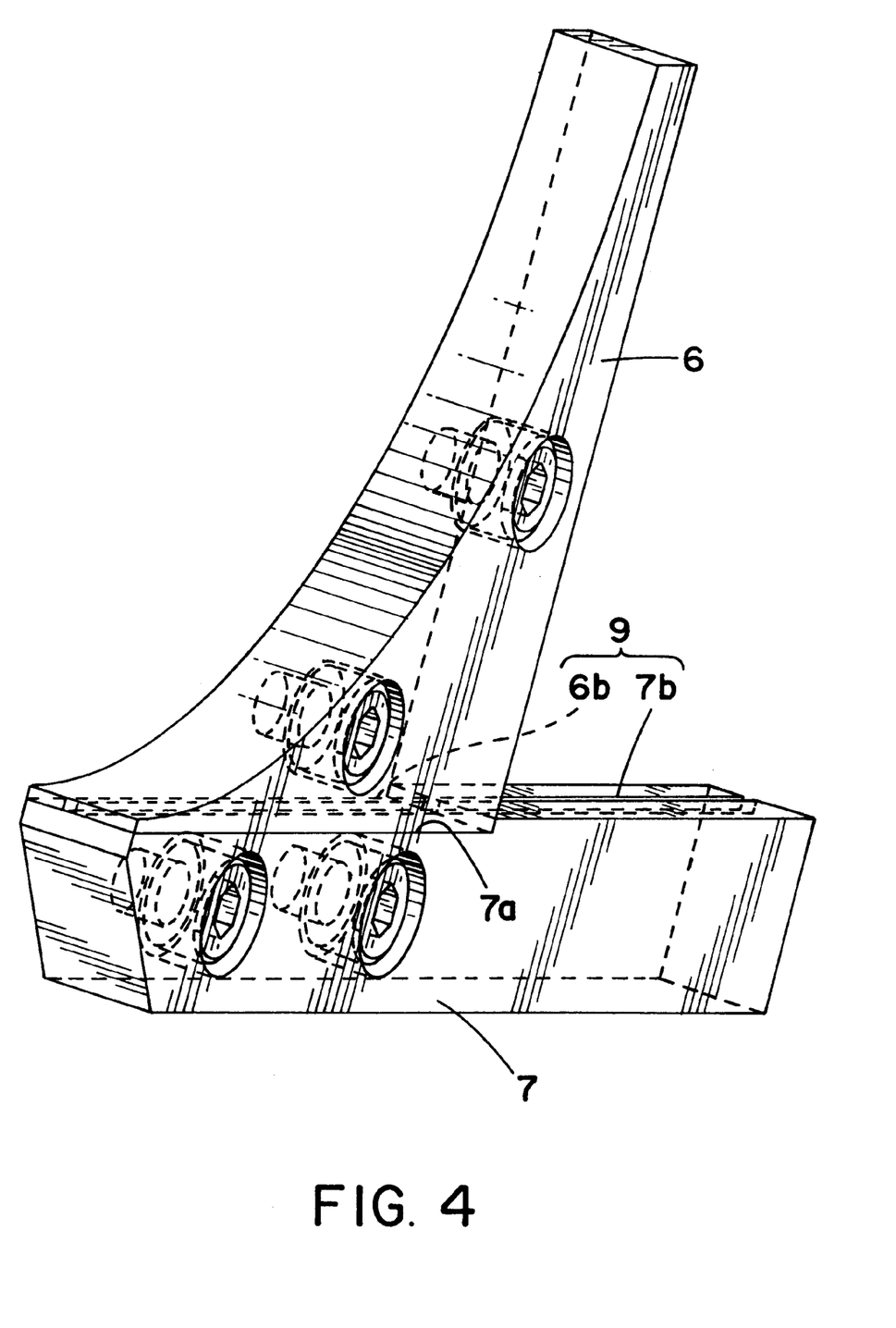
FIG. 4 is an enlarged perspective view of the first and second blocks of the apparatus shown in FIGS. 1–3.
Figure 5:
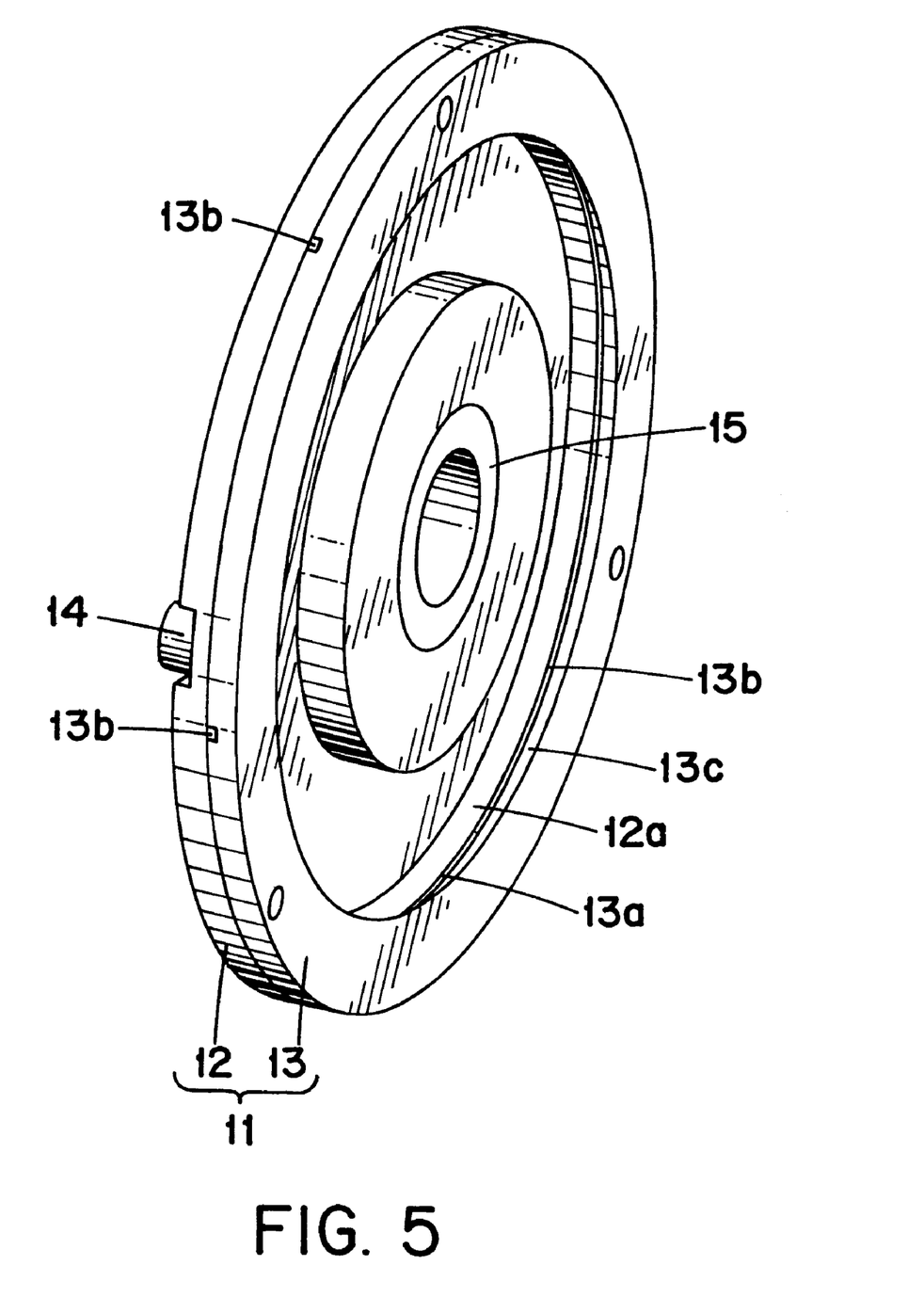
FIG. 5 is a perspective view of a rotary drum included in the apparatus shown in FIGS. 1–4, as viewed from inside.
Figure 6:
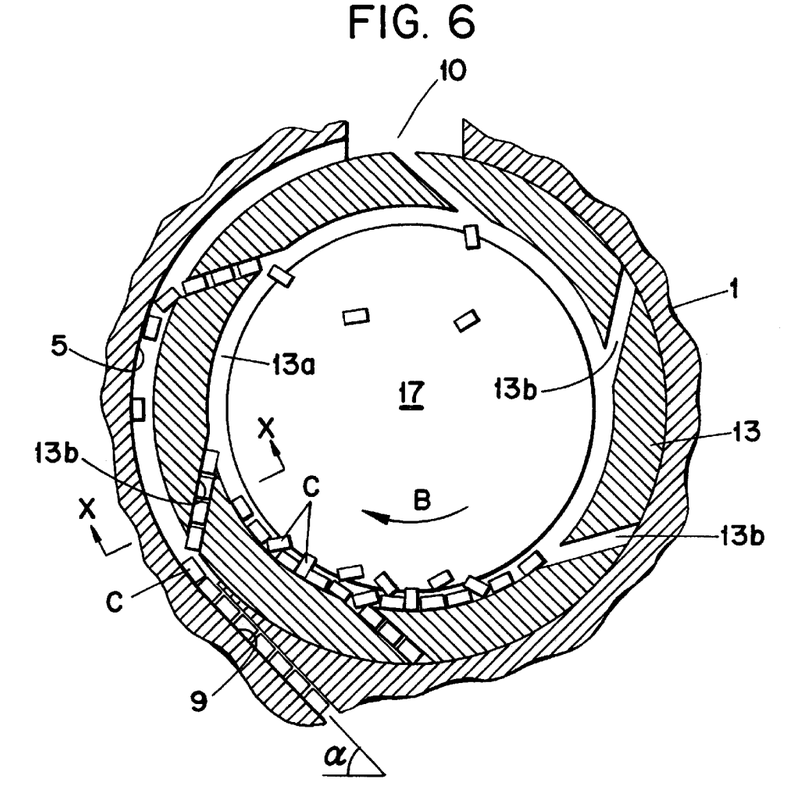
FIG. 6 is a diagram illustrating an operation of a part-aligning apparatus in accordance with the present invention to align and deliver parts.

A second block 7 is fixed in the cutout 2a of the recess 2 adjacent to the bottom surface of the first block 6. A first groove 6b is formed in the bottom surface of the first block 6, as shown in FIG. 4. A flat surface 7a closing off the bottom surface of the first block 6 and a second groove 7b continuous with the first groove 6b are formed in the top surface of the second block 7. The first block 6 and the second block 7 are fixed to the stationary drum 1, forming a discharge passage 9 that is placed in communication with the guide groove 5 through the two grooves 6b and 7b, respectively. The discharge passage 9 is tangent to the arc-shaped guide groove 5 and tilted downward at a given slide angle α (e.g., $\alpha=\theta_1$). Preferably, this slide angle α is set within a range given by the approximate relationship: $30° \leq \alpha < 90°$. The guide groove 5 and the discharge passage 9 are so dimensioned that the chip parts C can pass one by one in the longitudinal direction. That is, their height and width are slightly larger than the height H and the width W of the chip parts, and less than length L of the chip parts. A part introduction port 10 in communication with the recess 2 is formed in the top surface of the stationary drum 1.

The recess 2 in the stationary drum 1 is closed by a rotary drum 11. This rotary drum 11 is rotatably mounted to the stationary drum 1 by fastening together a disk 12 and an annular portion or ring 13 with a screw 14 (in this discussion, the term "screw" is used broadly to encompass threaded bolts, etc.), fitting a bearing 15 in the center of the disk 12 over the rotating shaft 3, and securing the bearing 15 with a screw 16. A part-holding chamber 17 for accommodating a number of chip parts C is formed between both drums 1 and 11. The chip parts C introduced from the part introduction port 10 are received in this chamber. Preferably, the rotary drum 11 is made of a transparent material such as acrylic resin to permit visual verification of the quantity of the chip parts C inside the part-holding chamber 17. It is also possible to form an anti-static coating on the inner surface of the rotary drum 11.

An arc-shaped chute groove 13a is formed along the entire inner surface of the ring 13. Plural gate grooves or holes (6 grooves in the illustrated example) 13b are formed in one side surface of the ring 13, each extending from the ring's inner surface to the outer surface. These grooves or holes 13b are substantially (e.g., approximately, but not necessary exactly) tangent to the chute groove 13a. The ring 13 is fixed to the inner surface of the disk 12, thus properly defining the chute groove 13a and gate holes 13b in accordance with the present invention. The inner opening of the gate hole 13b is in communication with the chute groove 13a. The direction of each gate hole 13b is not limited to the direction tangent to the chute groove 13a. However, it is preferred that the direction of the gate holes 13b be inclined in a direction opposite to the direction of rotation B of the rotary drum 11 about the direction of the normal. As shown in FIG. 7, tapering surfaces 12a and 13c inclined toward the chute groove 13a are formed to cause the chip parts inside the part-holding chamber 17 to slide toward the chute groove 13a.

The chute groove 13a and the gate hole 13b are so dimensioned that the chip parts C pass one by one in the longitudinal direction. That is, their height (depth) and width are slightly greater than the height H and the width W and less than the length L of each chip part.

A driving pulley 20 and a follower pulley 21 are rotatably disposed on the front side of the stationary drum 1 and around the recess 2. A belt 22 is wound around the pulleys 20 and 21. The follower pulley 21 is rotatable about a rotating shaft 23 protruding from the stationary drum 1. An electric motor 24 has a rotating shaft 24a disposed on the back of the stationary drum 1, and the rotating shaft 24a is connected to the axial center of the driving pulley 20. When the rotating shaft 24a of the motor 24 rotates in the direction A, the belt 22 wrapped around the pulleys 20 and 21 moves while in contact with the outer surface of the rotary drum 11. Thus, the drum 1 rotates in the direction B via the frictional force provided by the belt 22.

The method of driving the rotary drum 11 is not limited to the above-described indirect driving method, i.e., in which the belt 22 is rotated while being kept in contact with the outer surface of the rotary drum 11. Of course, the rotary drum 11 can be directly driven by the motor 24. That is, for instance, the rotating shaft 24a of the motor 24 can be connected to the axial center of the rotary drum 11 to directly drive the rotary drum 11.

The operation of the part-aligning apparatus of the construction described above is next described by referring to FIGS. 6 and 7. First, the chip parts C are introduced into the part-holding chamber 17 from the part introduction port 10. The chip parts C are collected in the chute groove 13a by means of the tapering surfaces 12a and 13c formed in the stationary drum 1 and the rotary drum 11, respectively. The width of the chute groove 13a is equal to the sum of the width W of each chip part C and the given clearance. The depth of the chute groove 13a is equal to the sum of the height H and a certain clearance. The chip parts C are oriented in a given direction by the chute groove 13a. As the rotary drum 11 rotates in the direction B, the chip parts C slide downward in the chute groove 13a and enter the gate holes 13b. Then, the parts pass through the gate holes 13b, enter the guide groove 5, slide downward in the guide groove 5, and are delivered from the discharge passage 9 as a successive array of chip parts.

The chip parts sliding down the chute groove 13a in an upright orientation cannot enter the gate holes 13b and therefore come to a stop at the entrance of the gate holes 13b, thus clogging these holes. These clogging chip parts, however, fall away from the entrance of their respective gate hole entrances as the rotary drum 11 rotates. Then, these chip parts fall downward due to gravity and return to the pool of chip parts in the part-holding chamber 17. Accordingly, the clogging of the gate holes 13b is removed through the motion of the rotary drum 11.

Those chip parts that remain in a gate hole 13b without being discharged into the guide groove 5 are returned into the part-holding chamber 17 when the gate hole 13b is rotated to the top (e.g., rendering the gate hole 13b vertical, or at some semi-vertical orientation).

In the case of some known bulk feeders, all the selections concerning the orientation of the chip parts with respect to their height, width, and length (H, W, L) dimensions are made in one operation, and thus the alignment efficiency can be low. As in the above embodiment, a selection is made concerning the orientation of the parts with respect to their height and width (H, W) dimensions by means of the dimensions of the chute groove 13a formed in the rotary drum 11. A selection is made concerning the orientation of the parts with respect to their length (L) dimension by means of the dimensions of the gate holes 13b. Hence, the alignment efficiency is much higher than that of some known bulk feeders. Furthermore, the rotary drum 11 can be rotated slowly, since the rate at which the chip parts are delivered is hardly affected by the rotational speed of the rotary drum 11. In this case, the parts are damaged to a lesser extent compared to some known feeders. In addition, the apparatus is quiet in operation.

The guide groove 5 formed in the stationary drum 1 extends through a given angle to accept as many chip parts delivered from the gate holes 13b as possible. Therefore, the chip parts can be efficiently discharged into the discharge passage 9. In addition, the guide groove 5 acts as a buffer when the discharge passage 9 becomes clogged or overflows.

In the present invention, the rotary drum 11 is rotated to stir the chip parts that form a bridge over the tapering surfaces 12a and 13c and do not easily drop into the chute groove 13a, and hence the drum 11 promotes the receipt of the chip parts into the chute groove 13a. If the number of the chip parts remaining in the part-holding chamber 17 is very few, only a few chip parts enter the gate holes 13b. The gate holes 13b formed in the rotary drum 11 are rotated to force the chip parts remaining at the bottom of the part-holding chamber 17 into the gate holes 13b via the chute groove 13a. As a consequence, every chip part inside the part-holding chamber can be discharged. Furthermore, where a large number of chip parts are introduced into the part-holding chamber 17, the load may affect the chip parts aligned near the gate hole 13b, and as such, the flow of the chip parts might be impeded. However, rotation of the rotary drum 11 relieves the load periodically. Hence, the chip parts can pass through the gate hole 13b smoothly.

In the present invention, each chip part slides down the chute groove 13a and one of the gate holes 13b by its own weight and is not restricted, unlike some known techniques. Therefore, if the discharge passage 9 becomes clogged or overflows, it is unlikely that the chip parts will be damaged or that the apparatus will break down. In particular, if the discharge passage 9 becomes clogged or overflows, the chip parts C simply stay in the guide groove 5. The parts are not pushed from their rear sides. As such, the chip parts are not overloaded. That is, if the discharge passage 9 becomes clogged or overflows, no problems occur provided that the rotary drum 11 is kept rotating.

Figure 9:
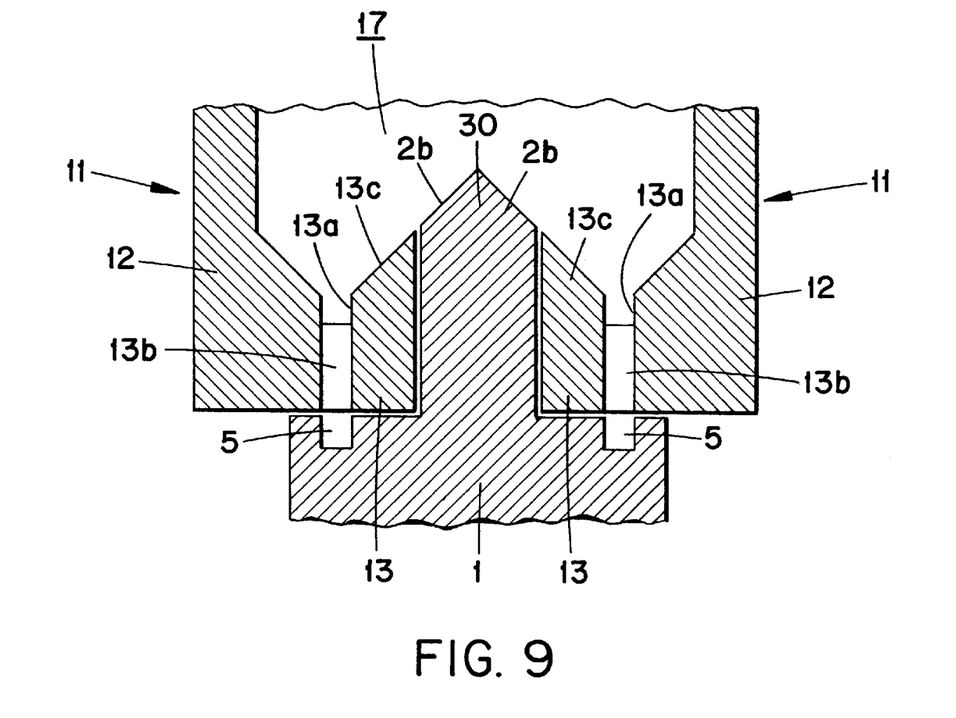
FIG. 9 is a cross-sectional view of another exemplary part-aligning apparatus in accordance with the invention.

Referring next to FIG. 9, there is shown another exemplary part-aligning apparatus in accordance with the present invention. Note that like components are indicated by like reference numerals in various figures and that those components which have been already described will not be described below.

In this embodiment, rotary drums 11 are mounted to both sides of the stationary drum 1. Two guide grooves 5 are formed in the inner surface of the stationary drum 1. This stationary drum 1 is substantially cylindrical and has ports at its front and rear sides. An annular portion 30 protruding inwardly is formed in the center. Tapering surfaces 2b inclined toward each chute groove 13a are formed on both side surfaces of the protruding portion 30. These tapering surfaces 2b are continuous with the tapering surfaces 13c of the ring 13. Gate holes 13b are formed continuously at the bottoms of the chute grooves 13a. In the embodiment described above, only one part-holding chamber 17 is formed. In this embodiment shown in FIG. 9, there are two chute grooves 13a. This improves the efficiency at which the chip parts C are aligned and delivered.

Figure 10:
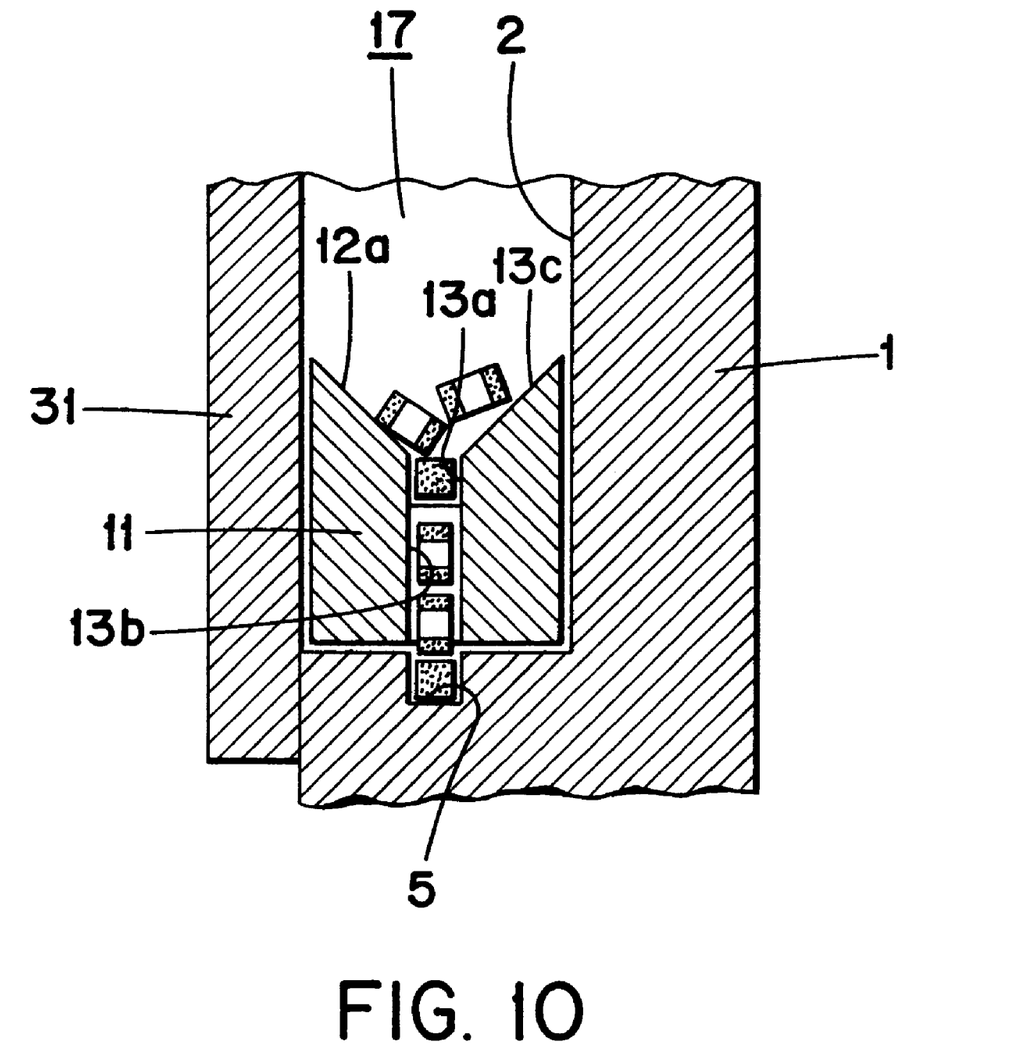
FIG. 10 is a cross-sectional view of a further exemplary part-aligning apparatus in accordance with the invention.

Another exemplary part-aligning apparatus in accordance with the present invention is shown in FIG. 10. The components of this apparatus that are the same as their counterparts in the first-mentioned embodiment are indicated by the same reference numerals as in the first-mentioned embodiment. In the two embodiments described above, the part-holding chamber 17 is formed between the stationary drum 1 and the rotary drum 11. In this embodiment shown in FIG. 10, the part-holding chamber 17 comprises the stationary drum 1 and a cover member 31. The rotary drum 11 in an annular form is rotatably received in this chamber. Of course, plural guide grooves 5 may be formed in the inner surface of the stationary drum 1 in the same way as in FIG. 9.

Figure 11:
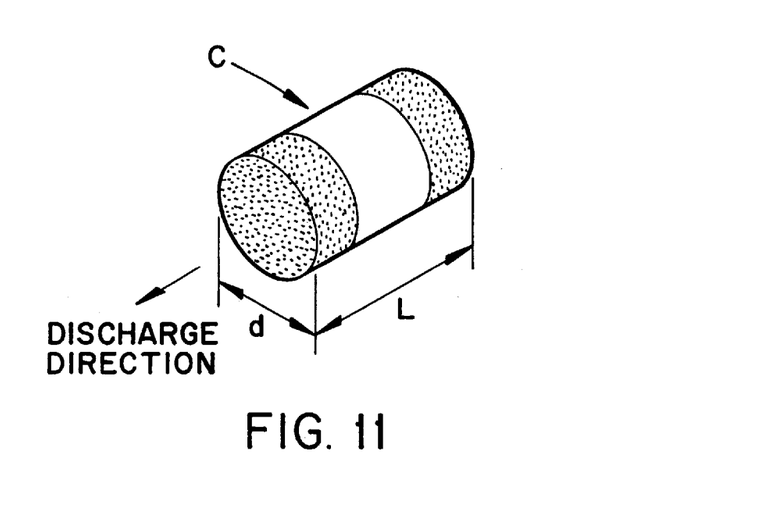
FIG. 11 is a perspective view of another example of a chip part.

In the above embodiments, the boxlike chip part C having substantially identical width W and height H and a larger length L was considered as an example. The aforementioned part-aligning apparatus can also align cylindrical chip parts C having a diameter d (where d effectively defines the W and H dimensions, e.g., d≈W≈H) and a length L (where L>d) as shown in FIG. 11. The apparatus can also align other chip parts having a diameter d which is equal to the length L or a diameter d which is greater than the length L.

Figures 12A, 12B:
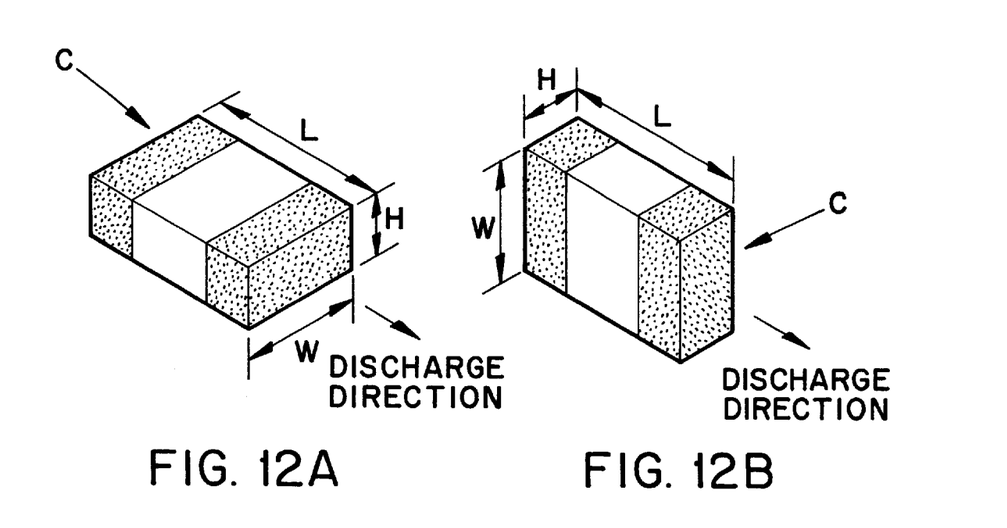
FIG. 12 is a perspective view of a further example of a chip part.

It is also possible to align boxlike chip parts C whose width W and height H are different from each other (e.g., L>W>H), as shown in FIGS. 12(A) and 12(B). The parts can be discharged such that the width W is placed in a horizontal orientation as shown in FIG. 12(A) or in a vertical orientation as shown in FIG. 12(B) by setting the dimensions of the groove 13a and holes 13b appropriately. Furthermore, the apparatus can align cubic chip parts whose W, H, and L dimensions are the same by again setting the dimensions of the groove 13a and holes 13b appropriately.

Of course, the invention is not limited to the above embodiments. In the above embodiments, the gate holes 13b are formed substantially tangent to the chute groove 13a. The invention is not limited to this structure. The gate holes may be shaped in any desired form as long as the chip parts can smoothly pass from the chute groove 13a to the gate holes 13b without changing direction. Therefore, the gate holes 13b need not be rectilinear. Also, the discharge passage 9 is not required to be tangent to the guide groove 5 or rectilinear.

In the above embodiments, the ring 13 forming the annular portion is fixed to the disk 12 to constitute the rotary drum 11. Of course, these components may be integrally cast or fabricated. In addition, in the above embodiments, the inclined surfaces (tapering surfaces) 12a and 13c for causing the chip parts to slide toward the chute groove 13a are formed on both sides of the chute groove 13a. However, a tapering surface can be formed on only one side.

As can be understood from the description provided thus far, in the present invention, chip parts are caused to fall into a chute groove, where they are aligned. The parts then pass through gate holes into a guide groove. The parts are then discharged. In this manner, the chip parts can be supplied in a given orientation. Therefore, the part-holding apparatus can be made very simple in structure. Also, the apparatus rarely breaks down. Each chip part is made to slide along the chute groove by its own weight instead of restricting the chip parts by applying force directly thereto. Then, the chip parts are discharged via the gate holes. Consequently, the chip parts are prevented from being overloaded. Reduced problems will occur even if the discharge passage is clogged or overflows.

If the entrance of a gate hole becomes clogged with a chip part, rotation of the rotary drum removes the clogging chip part from the entrance through the effects of gravity. As a consequence, the chip parts are damaged to a lesser extent compared to some known feeders. The part yield can also be improved.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims.

What is claimed is:

1. A part-aligning apparatus comprising:
    a part-holding chamber for accommodating a number of chip parts, said part-holding chamber having an outer wall;
    a rotary drum having an annular portion forming said outer wall of said part-holding chamber, said annular portion having an inner and outer surface;
    a chute groove formed in the inner surface of said annular portion;
    a gate hole extending through said annular portion from its inner to outer surface, said gate hole being in communication with said chute groove, said gate hole having a lower end formed at the outer surface; and
    a stationary member having an inner surface provided with a guide groove corresponding in position to the lower end of said gate hole;
    wherein said chip parts pass from said part-holding chamber to said chute groove, and from said chute groove to said gate hole, and from said gate hole to said guide groove.

2. The part-aligning apparatus of claim 1, wherein said stationary member comprises a stationary drum, and said guide groove is shaped in an arc.

3. The part-aligning apparatus of claim 1, further including:
    a discharge passage connected with a lower end of said guide groove.

4. The part-aligning apparatus of claim 3, wherein said discharge passage is substantially tangent to said guide groove.

5. The part-aligning apparatus of claim 1, wherein said chute groove and said gate hole are so shaped as to align said chip parts in a selected orientation.

6. The part-aligning apparatus of claim 1, wherein said gate hole is substantially tangent to said chute groove.

7. The part-aligning apparatus of claim 1, wherein said gate hole is inclined with respect to the normal of said rotary drum in a direction opposite to a direction in which the rotary drum is rotated.

8. The part-aligning apparatus of claim 1, wherein said gate hole has dimensions which prohibit said chips parts from passing therethrough unless said chip parts have a selected orientation with respect to said gate hole.

9. The part-aligning apparatus of claim 1, further comprising plural gate holes formed in said annular portion.

10. The part-aligning apparatus of claim 1, wherein an inclined surface is formed in the inner surface of said annular portion to cause the chip parts to slide toward said chute groove.

11. The part-aligning apparatus of claim 1, further comprising plural chute grooves formed lateral to each other and in parallel in said annular portion, and further including plural guide grooves associated with respective said plural chute grooves.

12. The part-aligning apparatus of claim 1, wherein:
   each of said chip parts has a length L greater than its height H and width W;
   said chute groove and said guide groove have a width greater than said height H and said width W and less than said length L, and
   said chute groove and said guide groove have a depth greater than said height H and said width W and less than said length L.

13. The part-aligning apparatus of claim 1, wherein said rotary drum is driven by a motor.

14. The part-aligning apparatus of claim 13, wherein said motor is connected to a driving pulley via a rotation shaft, and said driving pulley is connected to a follower pulley via a belt, wherein said belt is in frictional engagement with said rotary drum, such that rotation of said shaft causes movement of said belt, which in turn causes rotation of said rotary drum.

15. The part-aligning apparatus of claim 1, wherein said rotary drum comprises an annular ring member placed in contact with a disk, said annular ring member forming said annular portion.

16. The part-aligning apparatus of claim 15, wherein said gate hole and said chute groove are formed in a surface of said ring member which faces said disk.

17. A method for aligning chip parts, comprising the steps of:
   (a) feeding a plurality of chip parts into a part-holding chamber of a part-aligning apparatus, said apparatus having:
      i) a rotary drum having an annular portion forming an outer wall of said part-holding chamber, said annular portion having an inner and outer surface;
      ii) a chute groove formed in the inner surface of said annular portion;
      iii) a gate hole extending through said annular portion from its inner to outer surface, said gate hole being in communication with said chute groove, said gate hole having a lower end formed at the outer surface; and
      iv) a stationary member having an inner surface provided with a guide groove corresponding in position to the lower end of said gate hole;
   (b) rotating said rotary drum to cause displacement of said chip parts in said part-holding chamber;
   (c) receiving said chip parts in said chute groove in a given orientation;
   (d) forwarding said chip parts from said chute groove to said gate hole; and
   (e) forwarding said chip parts from said gate hole to said guide groove.

18. The method of claim 17, wherein said stationary member comprises a discharge passage, and said method further comprises the step of:
   (f) forwarding said chip parts from said guide groove to said discharge passage.

19. A rotary drum for use in a part-aligning apparatus, said rotary drum comprising:
   an inner cavity defining a parts-holding chamber for accommodating a number of chip parts, said part-holding chamber having an outer wall;
   an annular portion forming said outer wall of said part-holding chamber, said annular portion having an inner and outer surface;
   a chute groove formed in the inner surface of said annular portion; and
   a gate hole extending through said annular portion from its inner to outer surface, said gate hole being in communication with said chute groove.

20. The rotary drum of claim 1:
   wherein said gate hole is formed at an angle with respect to the normal of said rotary drum.

* * * * *